(12) United States Patent  (10) Patent No.: US 8,692,251 B2
Moriwaki                    (45) Date of Patent:     Apr. 8, 2014

(54) CIRCUIT BOARD AND DISPLAY DEVICE

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 665 days.

(21) Appl. No.: 12/679,510

(22) PCT Filed: Oct. 14, 2008

(86) PCT No.: PCT/JP2008/068591
§ 371 (c)(1),
(2), (4) Date: Mar. 23, 2010

(87) PCT Pub. No.: WO2009/057444
PCT Pub. Date: May 7, 2009

(65) Prior Publication Data
US 2010/0193793 A1    Aug. 5, 2010

(30) Foreign Application Priority Data
Nov. 2, 2007  (JP) ................................. 2007-286363

(51) Int. Cl.
*H01L 33/00*  (2010.01)

(52) U.S. Cl.
USPC ...................... 257/59; 257/E33.062

(58) Field of Classification Search
None
See application file for complete search history.

(56) References Cited

U.S. PATENT DOCUMENTS

| 6,593,592 | B1 | 7/2003 | Yamazaki et al. |
| 6,618,029 | B1 * | 9/2003 | Ozawa ............................. 345/82 |
| 7,645,646 | B2 * | 1/2010 | Young ............................ 438/145 |
| 7,754,541 | B2 * | 7/2010 | Takeguchi et al. ............. 438/149 |
| 2004/0016924 | A1 | 1/2004 | Yamada et al. |
| 2004/0029338 | A1 | 2/2004 | Yamazaki et al. |
| 2004/0113142 | A1 | 6/2004 | Ishikawa et al. |
| 2004/0135175 | A1 | 7/2004 | Kurokawa |
| 2005/0040531 | A1 | 2/2005 | Kurokawa |
| 2007/0228441 | A1 * | 10/2007 | Choi et al. ..................... 257/300 |
| 2007/0235777 | A1 * | 10/2007 | Nagata ........................... 257/288 |
| 2008/0067570 | A1 * | 3/2008 | Yamashita et al. ............ 257/306 |
| 2008/0303065 | A1 | 12/2008 | Kurokawa |
| 2009/0004846 | A1 | 1/2009 | Kurokawa |

FOREIGN PATENT DOCUMENTS

| CN | 1581472 A | 2/2005 |
| JP | 8-316310 A | 11/1996 |
| JP | 10-48660 | 2/1998 |
| JP | 2000-284722 | 10/2000 |
| JP | 2003-338509 | 11/2003 |
| JP | 2004-177892 A | 6/2004 |
| JP | 2004-221559 A | 8/2004 |
| JP | 2005-72573 A | 3/2005 |

* cited by examiner

*Primary Examiner* — Benjamin Sandvik
(74) *Attorney, Agent, or Firm* — Birch, Stewart, Kolasch & Birch, LLP

(57) ABSTRACT

The present invention provides a circuit board having a reduced wiring area in a circuit portion and therefore suitably used for reduction in a display region of a display device, and further provides a display device including such a circuit board. The present invention is a circuit board including:
a substrate;
a semiconductor layer;
a gate insulating film;
a gate electrode layer; and
two or more interlayer insulating films,
the semiconductor layer, the gate insulating film, the gate electrode layer, and the two or more interlayer insulating films being stacked on the substrate in this order,
wherein the circuit board further includes a signal supply wiring such as a power line, a source bus line, a video line; and an interconnection wiring included in a circuit such as an inverter,
the signal supply wiring being arranged in a layer upper than the two or more interlayer insulating films, and
the interconnection wiring included in a circuit being arranged between any adjacent two of the two or more interlayer insulating films.

9 Claims, 2 Drawing Sheets

CIRCUIT BOARD AND DISPLAY DEVICE

TECHNICAL FIELD

The present invention relates to a circuit board and a display device. More particularly, the present invention relates to a circuit board preferably used in portable electronic devices such as a cellular phone, and to a display device including such a circuit board.

BACKGROUND ART

Portable electronic devices such as a cellular phone and a PDA, which include a liquid crystal display device, an organic electroluminescent display device, or the like, now need a further reduction in their size and weight. Along with this, downsize of a periphery of a display region, i.e., a reduction in area of a frame region of such display devices is needed, and a technology of satisfying such a need is now being researched and developed. In addition, in view of thin profile and cost effectiveness, and the like as well as the reduction in area of the frame region, display devices including a full-monolithic circuit board where a peripheral circuit needed for driving a device, such as a power source circuit, a driver circuit, and a latch circuit, and the like are arranged on a substrate is increasingly employed.

However, such a full-monolithic circuit board is manufactured by a technology of forming an integrated circuit in a periphery of a pixel region of a glass substrate. Such a technology contradicts a technology needed for the reduction in area of the frame region. As a method for the reduction in area of the frame region of the display devices including a full-monolithic circuit board, a technology of forming a multi-layer wiring in a panel is being used. For example, Patent Document 1 discloses a method for producing a wiring board including a space-saving and high function circuit on a substrate with an insulating surface, the wiring board including a multi-layer wiring structure composed of: first, second, and third wirings; first and second interlayer insulating films; and first and second contact holes.

With regard to transistors that are formed on a glass substrate, an improvement in characteristics thereof largely depends on a thickness of an interlayer insulating film formed on the transistors. For example, a top-gate thin film transistor, disclosed in Patent Document 2, includes a transistor-covering interlayer insulating film which has a stacked-layer structure in which a silicon nitride film and a silicon oxide film are stacked from a gate insulating film side in this order, the silicon nitride film having a thickness of 50 nm or more and 200 nm or less. The silicon nitride film with such a thickness is arranged as a gate insulating film-side interlayer insulating film, which allows sufficient hydrogen to be supplied from the silicon nitride film to an active layer made of polycrystalline silicon and the like for terminating a dangling bond in the active layer.

[Patent Document 1]
  Japanese Kokai Publication No. 2005-72573
[Patent Document 2]
  Japanese Kokai Publication No. 2003-338509

DISCLOSURE OF INVENTION

However, in Patent Document 1, the second wiring connects the first wiring to the third wiring through the first and second contact holes. The connection between the first and second wirings and the connection between the second and third wirings are provided by different contact holes. Therefore, an area for the second wiring is needed, which results in decrease in an integration degree of the circuit. In this respect, such a wiring board in Patent Document 1 has room for improvement. Further, in Patent Document 1, an organic film and the like are formed in a layer upper than the two interlayer insulating films. Therefore, an additional interlayer insulating film needs to be formed, which increases the number of production steps. In this respect, such a wiring board in Patent Document 1 has room for improvement.

The invention disclosed in Patent Document 2 also has room for improvement in reduction in area of a frame region. In such a configuration, wirings can not be drawn between the two interlayer insulating films having the above-mentioned thickness because characteristics of the thin film transistor are reduced.

The present invention has been made in view of the above-mentioned state of the art. The present invention has an object to provide a circuit board suitable for reduction in area of a frame region of a display device, the circuit board having a multi-layer wiring structure formed without any changes of interlayer insulating film thickness nor formation of additional interlayer insulating films and therefore capable of reducing an area of a region where wirings are arranged in the circuit portion, i.e., a wiring area of the circuit portion. The present invention has another object to provide a display device including such a circuit board.

The present inventors made various investigations on a circuit board suitable for reduction in area of a frame region of a display device. The inventors noted a method for reducing an area of a portion where wirings are arranged in a frame region, i.e., a wiring area in a flame region. The inventors further noted the following configuration. In a multi-layer structure of two interlayer insulating films and a wiring disposed therebetween, if the two interlayer insulating films have a large thickness, a wiring for connecting an upper wiring to a lower wiring, the upper and lower wirings are arranged with the two interlayer insulating films therebetween, needs to be arranged between the two interlayer insulating films, which increases the wiring area. In a multi-layer structure of two interlayer insulating films and a wiring disposed therebetween, if the two interlayer insulating films have a small thickness, for example, a decrease in conductivity of a semiconductor layer might affect characteristics of the thin film transistor or heat generation might occur due to a parasitic capacitance formed between the wiring and a gate electrode. The inventors found that the above problems can be solved if the above-mentioned circuit board is formed to include a signal supply wiring arranged in a layer upper than the two or more interlayer insulating films and an interconnection wiring included in a circuit arranged between any adjacent two of the two or more interlayer insulating films. The two wirings formed in different layers can be used for different purposes. As a result, the wiring area can be reduced, thereby reducing an area of a flame region without increasing a thickness of the interlayer insulating films. Thus, the above-mentioned problems have been admirably solved, leading to completion of the present invention.

That is, a first aspect of the present invention provides a circuit board comprising:
  a substrate;
  a semiconductor layer;
  a gate insulating film;
  a gate electrode layer; and
  two or more interlayer insulating films,
  the semiconductor layer, the gate insulating film, the gate electrode layer, and the two or more interlayer insulating films being stacked on the substrate in this order, wherein the circuit board further includes a signal supply wiring and an interconnection wiring included in a circuit, the signal supply wiring being arranged in a layer upper than the two or more interlayer insulating films, and the interconnection wiring included in a circuit being arranged between any adjacent two of the two or more interlayer insulating films.

The present invention is described in more detail below.

The circuit board of the present invention includes: a semiconductor layer; a gate insulating film; a gate electrode layer; and two or more interlayer insulating films, stacked in this order on a substrate. The substrate is not particularly limited. When the circuit board is used in a display device and the like, a transparent substrate such as a glass substrate and a plastic substrate, or a stainless substrate and the like is preferably used as the substrate. The semiconductor layer preferably includes a gate region, a source region, and a drain region. The gate insulating film is a layer (interlayer) formed between the gate electrode layer and the semiconductor layer. The material for the gate insulating film is not particularly limited as long as the film is made of an insulating material. The gate electrode layer is an electrode-containing layer formed on the gate insulating film that is formed on the semiconductor layer. The gate electrode layer includes, for example, a gate electrode that drives a thin film transistor and a gate wiring that is formed in continuity with the gate electrode. The material for the two or more interlayer insulating films is not particularly limited as long as the films are made of an insulating material. The films are preferably constituted by at least an inorganic insulating film including silicon such as silicon oxide and silicon nitride.

The circuit board includes a signal supply wiring arranged in a layer upper than the two or more interlayer insulating films, and an interconnection wiring included in a circuit, formed between any adjacent two of the two or more interlayer insulating films. This circuit board includes such two or more interlayer insulating films, one of which being arranged in a layer upper than the two or more interlayer insulating films, another of which being arranged between any adjacent two thereof, and the two wirings are used for different purposes. In such a configuration, the increase in the total thickness of the two or more interlayer insulating films does not occur, and further, a decrease in conductivity of the semiconductor layer, an increase in power consumption and occurrence of a signal delay, due to an increase in wiring capacitance, and the like can be suppressed. In addition, since the two wirings are arranged in different layers, the wiring area can be reduced, thereby reducing an area of a frame region of a display device.

The total thickness of the two or more interlayer insulating films is preferably 1.5 μm or less, and more preferably 1.0 μm or less. When the interlayer insulating films have a thickness of 1.5 μm or less, the semiconductor layer, the gate electrode layer, and the interconnection wiring included in a circuit, and the like can be more reliably connected to the signal supply wiring. If the total thickness thereof is large, the semiconductor layer and the signal supply wiring, arranged with the two or more interlayer insulating films therebetween, might not be insufficiently connected to each other if a wiring for connecting the two to each other is not arranged between any adjacent two of the two or more interlayer insulating films. Further, if a contact hole with a large area is formed for reliable connection between the two wirings, the wiring area may be increased. When the total thickness of the two or more interlayer insulating films is 1.5 μm or less, and more preferably 1.0 μm or less, the signal supply wiring and the semiconductor layer are reliably connected to each other even if they are directly connected to each other with the two or more interlayer insulating films therebetween. This obviates the need of forming the wiring for connecting the two, which allows further reduction in area of a frame region of a display device.

The signal supply wiring may be preferably a wiring not included in a circuit, that is, a wiring outside a circuit block. Examples of the signal supply wiring include a power line, a source bus line, a video line, and the like. For example, a wiring capacitance formed in a region where the signal supply wiring which is arranged in a layer upper than the two or more interlayer insulating films overlaps with the gate electrode is smaller than that formed in a region with the same area where the interconnection wiring included in a circuit, arranged between the adjacent two interlayer insulating films, overlaps with the gate electrode layer. Therefore, by arranging the signal supply wiring such as a power line, a source bus line, and a video line, which are arranged above a circuit and overlap with other wirings with a large area, an increase in power consumption and occurrence of a signal delay, due to an increase in wiring capacitance, can be suppressed. As mentioned above, the signal supply wiring may be a wiring not included in a circuit (a wiring outside a circuit block), and specifically, may be at least one wiring selected from the group consisting of a power line, a source bus line, and a video line.

The power line is a wiring that supplies electricity to the circuit to be driven from the outside thereof. The power line is connected to an external connection terminal for power supply. The source bus line is a common line that connects sources of different thin film transistors to one another to permit data transmission between the thin film transistors. The source bus line is connected to a source driver. The video line is a wiring that is connected to an external connection terminal used as an image input/output terminal.

The interconnection wiring included in a circuit is preferably a wiring inside a circuit block. The type of the circuit is not particularly limited. Examples of the circuit include: a transmission circuit, a latch circuit, a timing generator, an inverter circuit including a power circuit, and an ESD (electrostatic discharge) protective circuit, which protects a semiconductor device from electrostatic discharge. By arranging the interconnection wiring included in a circuit between the adjacent two interlayer insulating films, an area in which the interconnection wiring included in a circuit overlaps with the gate electrode layer and the like can be reduced, and thereby increase in wiring capacitance formed by the wiring arranged between the interlayer insulating films and the gate electrode layer is suppressed. Thus, the interconnection wiring included in a circuit may be a wiring formed inside the circuit block. The circuit may be at least one circuit selected from the group consisting of a transmission circuit, a latch circuit, a timing generator, an inverter circuit, and an ESD protective circuit.

A second aspect of the invention provides a circuit board comprising:

a substrate;

a semiconductor layer;

a gate insulating film;

a gate electrode layer; and two or more interlayer insulating films, the semiconductor layer, the gate insulating film, the gate electrode layer, and the two or more interlayer insulating films being stacked on the substrate in this order, wherein the circuit board further includes a wiring not included in a circuit and an interconnection wiring included in a circuit, the wiring not included in a circuit being arranged in a layer upper than the two or more interlayer insulating films, and the interconnection wiring included in a circuit being arranged between any adjacent two of the two or more interlayer insulating films.

This circuit board includes such two or more interlayer insulating films, one of which being arranged in a layer upper than the two or more interlayer insulating films, another of which being arranged between any adjacent two thereof, and the two wirings are used for different purposes. In such a configuration, the increase in the total thickness of the two or more interlayer insulating films does not occur, and further, a decrease in conductivity of the semiconductor layer, an increase in power consumption and occurrence of a signal delay, due to an increase in wiring capacitance, and the like can be suppressed. In addition, since the two wirings are arranged in different layers, the wiring area can be reduced, thereby reducing an area of a frame region of a display device.

A wiring capacitance formed in a region where the wiring not included in a circuit, which is arranged in a layer upper than the two or more interlayer insulating films, overlaps with the gate electrode layer is smaller than that formed in a region with the same area where the interconnection wiring included in a circuit, arranged between the adjacent two interlayer insulating films, overlaps with the gate electrode layer. By arranging the wiring not included in a circuit, which is arranged above a circuit and overlaps with other wirings with a large area, in a layer upper than the two or more interlayer insulating films, an increase in power consumption and occurrence of a signal delay, due to an increase in wiring capacitance, can be suppressed.

Similarly to the circuit board of the first aspect of the present invention, the interconnection wiring included in a circuit is formed between the adjacent two interlayer insulating films. As a result, an area of a region where the interconnection wiring included in a circuit overlaps with the gate electrode layer and the like can be reduced, and thereby a wiring capacitance formed by the wiring arranged between the interlayer insulating films and the gate electrode layer can be suppressed.

Various embodiments described in the circuit board of the first aspect of the present invention can be appropriately applied to this circuit board.

The material for the signal supply wiring (or the wiring not included in a circuit) and the interconnection wiring included in a circuit is not particularly limited. The two wirings are preferably constituted of at least one the same material. When the two wirings that are made of the same material are directly connected to each other, the contact resistance can be decreased. Further, in order to improve the productivity, the two wirings are preferably made of the same material.

Preferable embodiments of the present invention are mentioned below.

It is preferred that the two or more interlayer insulating films are two interlayer insulating films composed of a first interlayer insulating film and a second interlayer insulating film, the second interlayer insulating film and the first interlayer insulating film being arranged in this order from the substrate side, and wherein the signal supply wiring (or the wiring not included in a circuit) is arranged on the first interlayer insulating film, and wherein the interconnection wiring included in a circuit is arranged between the first and second interlayer insulating films. Formation of such a two-layer structure where the second interlayer insulating film and the first interlayer insulating film are stacked allows a reduction in the total thickness of the two or more interlayer insulating films. As a result, process accuracy for forming a contact hole can be improved. When the two-layer structure is formed, the number of production steps can be reduced and productivity of the circuit including the two-layer structure can be improved as compared with when three or more interlayer insulating films are formed.

The signal supply wiring (or the wiring not included in a circuit) is connected to the semiconductor layer through a contact hole formed in the two or more interlayer insulating films. That is, the signal supply wiring (or the wiring not included in a circuit) is preferably connected to the semiconductor layer through no wiring layer positioned between the two or more interlayer insulating films. The signal supply wiring (or the wiring not included in a circuit) and the interconnection wiring included in a circuit are used for different purposes, and therefore the circuit board can be provided without increasing the thickness of the two or more interlayer insulating films. For example, even if an electrode for connecting the signal supply wiring (or the wiring not included in a circuit) and the semiconductor layer is not arranged between the two interlayer insulating films, the two can be connected to each other, and as a result, a drawing area of the wiring can be decreased. This permits a reduction in a frame region of a display device. The signal supply wiring (or the wiring not included in a circuit) is preferably connected to the gate electrode layer and the interconnection wiring included in a circuit through different contact holes, each formed in at least one of the two or more interlayer insulating films. That is, the signal supply wiring (or the wiring not included in a circuit) has separate connection parts through which the semiconductor layer, the interconnection wiring included in a circuit, and the gate electrode are connected to the signal supply wiring. According to this configuration, the signal supply wiring (or the wiring not included in a circuit) can be directly connected to each of the wirings, which allows formation of the wirings with a high degree of freedom. For example, formation of the electrode for connecting the signal supply wiring and the semiconductor layer, which leads to an increase in the wiring area, is not needed, and therefore, wirings formed in the same layer does not need to be formed to bypass each other for avoiding contact therebetween. As a result, an integration degree of the circuit is increased. When the signal supply wiring (or the wiring not included in a circuit) and the interconnection wiring included in a circuit are connected to each other and when the signal supply wiring (or the wiring not included in a circuit) and the gate electrode layer are connected to each other, the total thickness of the two or more interlayer insulating films can be decreased. Therefore, the times taken to form the interlayer insulating films and the contact hole can be shortened. As mentioned above, the interlayer insulating films can be formed to have a small thickness, and therefore, a contact hole for connecting the signal supply wiring (or the wiring not included in a circuit) and the gate electrode layer can be formed not to penetrate the gate electrode layer even if such a contact hole is simultaneously formed with a contact hole for connecting the signal supply wiring (or the wiring not included in a circuit) and the semiconductor layer by etching to penetrate the second interlayer insulating film in the same patterning step. Thus, the number of production steps can be reduced and productivity can be improved.

The interconnection wiring included in a circuit is preferably arranged so as not to overlap with the gate electrode layer. If the interconnection wiring included in a circuit is arranged to overlap with the gate electrode layer, a wiring capacitance formed in a region where the interconnection wiring included in a circuit overlaps with the gate electrode layer is larger than that formed in a region with the same area where the signal supply wiring (or the wiring not included in a circuit) overlaps with the gate electrode. Accordingly, if a wiring has to be arranged to overlap with the gate electrode layer, the signal supply wiring (or the wiring not included in a circuit) is preferably arranged as such a wiring. No overlapping between the gate electrode layer and the interconnection wiring included in a circuit allows suppression of the formation of wiring capacitance, power consumption, and occurrence of a signal delay and the like. Further, isolation between the gate electrode layer and the interconnection wiring included in a circuit can be maintained. When the gate electrode layer and the interconnection wiring included in a circuit are connected to each other, they overlap with each other at such a connection part but preferably not overlap with each other in other regions.

The above-mentioned first and second interlayer insulating films may be formed of the same material, but are preferably formed of different insulating materials. Use of different insulating materials allows the first and second interlayer insulating films to advantageously show different properties derived from the materials. For example, one of the first interlayer insulating film and the second interlayer insulating film is formed of a material with a low moisture permeability, and the other is formed of a material that supplies a large amount of hydrogen. The interlayer insulating films formed of such two different materials prevent moisture from entering a device, and an amount of hydrogen in the device can be adjusted. In view of this, it is preferred that the first interlayer insulating film is a silicon oxide film, and the second interlayer insulating film is a silicon nitride film. The silicon nitride film is preferably formed by PECVD. When the silicon nitride film is formed by PECVD, the obtained silicon nitride film contains a large amount of hydrogen. This hydrogen terminates a dangling bond in the semiconductor layer, which improves characteristics (conductivity and the like) of the semiconductor layer. Furthermore, when the first interlayer insulating film made of silicon oxide is formed on the second interlayer insulating film made of silicon nitride, the hydrogen from the silicon nitride film can be prevented from entering the first interlayer insulating film, which can also improve characteristics of the semiconductor layer. As mentioned above, the first interlayer insulating film may include silicon oxide and the second interlayer insulating film may include silicon nitride. Each thickness of the first interlayer insulating film and the second interlayer insulating filmis determined depending on a dielectric constant of a material for the interlayer insulating films, a wiring capacitance formed between the electrodes arranged with the interlayer insulating films therebetween, and the like. In order to hydrogenate the semiconductor layer, the first interlayer insulating film is preferably formed to have a thickness of 200 to 400 nm and the second interlayer insulating film is preferably formed to have a thickness of 600 to 800 nm.

Further, the first interlayer insulating film may include a spin-on-glass material. This allows a reduction in unevenness due to the gate electrode layer and the wiring between the interlayer insulating films. Further, each thickness of the gate electrode layer and the wiring between the interlayer insulating films can be increased. Further, occurrence of a short circuit in the signal supply wiring (or the wiring not included in a circuit) can be suppressed and the wiring resistance can be reduced. The first interlayer insulating film may have a structure in which a film (a flattening film) formed of a spin-on glass material and an insulating film (for example, an inorganic insulating film) formed by vapor deposition are stacked. As a result, adhesion between the first interlayer insulating film and the signal supply wiring (or the wiring not included in a circuit) formed thereon can be improved. In addition, the flattening film can be protected when ashing for removing a resist used for forming a contact hole in the flattening film and when the signal supply wiring (or the wiring not included in a circuit) is etched.

A total area of the interconnection wiring included in a circuit is smaller than a total area of the signal supply wiring (or the wiring not included in a circuit). As used herein, the phrase "wiring area" means the total area of wirings that are formed in the same step but each independently positioned. The signal supply wiring (or the wiring not included in a circuit) and the gate electrode layer have at least the two layers of the first interlayer insulating film and the second interlayer insulating film, therebetween. A wiring capacitance formed in a region where the interconnection wiring included in a circuit overlaps with the gate electrode layer is larger than that formed in a region with the same area where the signal supply wiring (or the wiring not included in a circuit) overlaps with the gate electrode. Therefore, an increase in the total wiring capacitance can be suppressed by reducing the wiring area of the interconnection wiring included in a circuit as compared with that of the signal supply wiring (or the wiring not included in a circuit). It is preferred that an overlapping area of the interconnection wiring included in a circuit and the signal supply wiring (or the wiring not included in a circuit) is smaller that that of the interconnection wiring included in a circuit, and a conductive member, arranged below the first interlayer insulating film.

The interconnection wiring included in a circuit has a wiring length shorter than a wiring length of the signal supply wiring (or the wiring not included in a circuit). As used herein, the phrase "wiring length" means a length from one end to the other of an electrode formed in continuity and in the same step. When a plurality of the signal supply wirings (or the wirings not included in a circuit) and a plurality of the interconnection wirings included in a circuit are arranged, each wiring length is represented by an arithmetic mean length of the wirings. A wiring capacitance formed in a region where the signal supply wiring (or the wiring not included in a circuit) overlaps with the gate electrode layer is smaller than that formed in a region with the same area where the interconnection wiring included in a circuit overlaps with the gate electrode. Therefore, the wiring area of the interconnection wiring included in a circuit can be reduced by forming the interconnection wiring included in a circuit to have a wiring length shorter than that of the signal supply wiring (or the wiring not included in a circuit). As a result, the total wiring capacitance can be reduced. Thus, an increase in power consumption and occurrence of signal delay, caused due to the wiring capacitance, can be suppressed.

The interconnection wiring included in a circuit has a thickness smaller than a thickness of the signal supply wiring (or the wiring not included in a circuit). Unevenness of the interlayer insulating film formed on the interconnection wiring included in a circuit can be reduced by forming the interconnection wiring included in a circuit to have a thickness smaller than that of the signal supply wiring (or the wiring not included in a circuit). Therefore, disconnection due to step-cut, and the like can be suppressed, thereby improving yield. The signal supply wiring (or the wiring not included in a circuit) preferably has a thickness of 400 to 800 nm, and more preferably 500 to 600 nm. The interconnection wiring included in a circuit is preferably formed to have a thickness of 100 to 400 nm, and more preferably 200 to 300 nm. Increase in resistance, possibly caused by decreasing the thickness of the interconnection wiring included in a circuit, causes no problem because the interconnection wiring included in a circuit has a short wiring length.

It is preferred that the circuit board is a pixel array substrate including a pixel storage capacitor, used in a display device, and the pixel storage capacitor includes an electrode formed in a step of forming the interconnection wiring included in a circuit. For example, when forming a switching element that drives a pixel, which is a single point in a display image, an electrode formed when the interconnection wiring included in a circuit is formed in the same step can be used as the electrode forming the pixel storage capacitor. In such a configuration, a pixel storage capacitance can be increased without increase in the wiring area. The pixel storage capacitor can be formed by silicon and the gate electrode layer with the gate insulating film therebetween, for example. In addition to this, the pixel storage capacitor can also be formed by using a source electrode in the structure in which the silicon, the gate oxide film (gate insulating film), the gate electrode layer, the second interlayer insulating film, and the source electrode are stacked in this order. The source electrode is the electrode formed when the interconnection wiring included in a circuit, arranged between the first and second interlayer insulating films, is formed in the same step. Thus, the storage capacitance is formed in the gate oxide film (gate insulating film) and the second interlayer insulating film to form a two-layer capacitor. Therefore, an area of the pixel storage capacitors can be reduced and an aperture ratio can be increased as compared with circuit boards including no two-layer capacitors. When using the second interlayer insulating film made of silicon nitride, the capacitance can be increased because the dielectric constant of silicon nitride is higher than that of silicon oxide, and thereby the aperture ratio can be further increased. The pixel storage capacitor is formed for holding a voltage applied for driving a pixel to liquid crystals, and such a capacitor might be said to be a pixel memory.

The present invention is also a display device including the above-mentioned circuit board. This display device has a reduced frame region, i.e., a display region large relative to the entire display device, because an area of the frame region where wirings drawn to the circuit are arranged can be decreased. Examples of the display device include a liquid crystal display device and an organic EL display device.

EFFECT OF THE INVENTION

According to the circuit board and the display device of the present invention, a wiring area can be reduced. As a result, the display device in which an area of a flame region is reduced can be provided.

BEST MODES FOR CARRYING OUT THE INVENTION

The present invention is described in more detail below with reference to Embodiments using drawings, but not limited thereto. In circuit boards of Embodiments 1 to 3, a source electrode is composed of a two-layer structure. A drain electrode is composed of a single layer and formed together with a second source electrode of the source electrode in the same step.

Embodiment 1

FIG. 1 is a cross-sectional view schematically showing a circuit board in accordance with Embodiment 1.

The circuit board of Embodiment 1 includes a base coat film 11 having a thickness of 150 nm formed on an entire surface of a substrate 10, as shown in FIG. 1. The base coat film 11 has a structure in which a silicon oxynitride (SiON) film having a thickness of 50 nm and a silicon oxide ($SiO_2$) film having a thickness of 100 nm are stacked. On the base coat film 11, a polycrystalline silicon (p-Si) semiconductor layer 12 having a thickness of 50 nm is formed. The semiconductor layer 12 includes a source region 12s, a gate region 12g, and a drain region 12d.

On the semiconductor layer 12, a gate insulating film 13a composed of a $SiO_2$ film having a thickness of 45 nm is formed, and thereon, a gate electrode 19 having a thickness of 400 nm composed of a tantalum nitride (TaN) film having a thickness of 30 nm and a tungsten (W) film having a thickness is 370 nm is formed to overlap with the gate region 12. On the gate electrode 19, a second interlayer insulating film 14a composed of a silicon nitride ($SiN_x$) film having a thickness of 250 nm is arranged.

On the second interlayer insulating film 14a, a second source electrode 17a and a second drain electrode 18a (they constitute a second wiring layer) are arranged in the same layer. On the electrodes 17a and 18a, a first interlayer insulating film 15a is arranged over the entire surface of the substrate. On the first interlayer insulating film 15a, a first source electrode 16a (a first wiring layer) is arranged. The electrode 16a is connected to the second source electrode 17a through a contact hole formed in the first interlayer insulating film 15a. Thus, the circuit board of the present Embodiment has a structure where the second source electrode 17a and the drain electrode 18a are arranged between the first interlayer insulating film 15a and the second interlayer insulating film 14a.

The second source electrode 17a is arranged as an interconnection wiring in a circuit such as a transmission gate, a latch circuit, and an inverter including a power circuit. The first source electrode 16a is preferably arranged in the upper layer of the circuit and arranged as a signal supply wiring (a wiring not included in a circuit), which overlaps with other wirings with a large area. Examples of the signal supply wiring (the wiring not included in a circuit) include a power line, a source bus line, and a video line. Thus, appropriate use of the first source electrode 16a and the second source electrode 17a as different kinds of wirings allows that in the circuit board, no power consumption in a wiring capacitance and no delay of signal transmission are generated and the wiring area in the frame region and the like is significantly decreased.

A production method of the circuit board of Embodiment 1 is described below. The substrate 10 is rinsed and pre-annealed as pre-treatments. The substrate 10 is not particularly limited, and a glass substrate is preferably used in view of costs, and the like. The following steps (1) to (12) are then performed.

(1) Step of Forming Base Coat Film

The base coat film 11 is formed by forming a SiON film and a $SiO_2$ film on the substrate 10 by PECVD (plasma enhanced chemical vapor deposition) and the like. A mixed gas of monosilane ($SiH_4$), nitrous oxide gas ($N_2O$), and ammonia ($NH_3$), and the like, is mentioned as a raw material gas for forming the SiON film. The $SiO_2$ film is preferably formed using TEOS (tetraethyl ortho silicate) gas as a raw material gas. A silicon nitride ($SiN_x$) film and the like, formed using a mixed gas of monosilane ($SiH_4$) and ammonia ($NH_3$) as a raw material gas may be used as the base coat film 11.

(2) Step of Forming Semiconductor Layer

An amorphous silicon (a-Si) film is formed by PECVD and the like. Monosilane ($SiH_4$), disilane ($Si_2H_6$), and the like, may be used as a raw material gas for the a-Si film.

Hydrogen exists in the a-Si film formed by PECVD, and so the a-Si film is subjected to a treatment for reducing the concentration of the hydrogen (dehydrogenation treatment) at about 500° C. Successively, the a-Si film is melted by laser annealing, and then cooled and solidified to give a p-Si film. For example, the laser annealing is performed using an excimer laser with an output power of about 200 W. In the formation of the p-Si film, as a pretreatment before the laser annealing, solid phase crystallization of the a-Si film may be performed by a heat treatment using a metal catalyst such as nickel applied on the a-Si film without the dehydrogenation treatment, thereby giving a CG (continuous grain)-silicon film as the p-Si film. Then, the p-Si film is patterned by dry etching using carbon tetrafluoride ($CF_4$) to give the semiconductor layer 12 having an island shape.

(3) Step of Forming Gate Insulating Film

Then, the gate insulating film 13a made of silicon oxide is formed using TEOS gas as a raw material gas. The material for the gate insulating film 13a is not particularly limited. A $SiN_x$ film, a SiON film, and the like, can be used as a material for the gate insulating film 13a. The raw material gases described in the base coat film-forming step are used as a raw material gas for forming the $SiN_x$ film and the SiON film. The gate insulating film 17 may be a multi-layer body composed of films formed of the above-mentioned materials.

(4) Ion Doping Step

The semiconductor layer 12 formed on the substrate 10 has a threshold value, which is one of TFT characteristics, shifted to minus direction from a proper value. Therefore, after the formation of the gate insulating film 13a, trivalent atoms such as boron are implanted into the whole semiconductor layer 12 for adjustment of the threshold value. Then, the semiconductor layer for N-ch is further doped with boron for adjustment of the threshold value of the N-channel region. As a result of the channel doping, the electrical conductivity of the gate region can be increased.

(5) Step of Forming Gate Electrode

Then, a tantalum nitride (TaN) film and a tungsten (W) film are formed by sputtering and the like. Then, a resist film is patterned into a desired shape by photolithography, and then the obtained TaN/W film is dry-etched using an etching gas composed of argon (Ar), sulfur hexafluoride ($SF_6$), carbon tetrafluoride ($CF_4$), oxygen ($O_2$), chlorine ($Cl_2$), and the like, whose amounts are adjusted. As a result, the gate electrode 19 is formed. Low-resistant metals such as tantalum (Ta), molybdenum (Mo), molybdenum tungsten (MoW), and aluminum (Al); and high-melting-point metals that can be easily processed into a film with a flat surface and have stable characteristics, are used for the gate electrode 19. The gate electrode 19 may have a multi-layer body composed of films formed of the above-mentioned materials.

(6) Step of Forming Source Region and Drain Region

The resist film is patterned into a desired shape by photolithography. Then, in order to form an Nch-TFT, regions that are to constitute the source and drain regions 12s and 12d are heavily doped with pentavalent atoms such as phosphorus by ion doping and the like. In order to form a Pch-TFT, the regions are heavily doped with trivalent atoms such as boron by ion doping. If necessary, an LDD (lightly doped drain) structure may be formed. Then, the semiconductor layer 12 is subjected to a thermal activation treatment for 6 hours at about 700° C. to activate the impurity ions implanted therein. As a result, the electrical conductivity of the source region 12s and the drain region 12d can be improved. Excimer laser may be radiated for the activation, for example.

(7) Step of Forming Second Interlayer Insulating Film

Then, a $SiN_x$ film is formed as the second interlayer insulating film 14a over the entire surface of the substrate 10 by PECVD. The second interlayer insulating film 14a may be a SiON film, a TEOS film, and the like. In order to secure reliability of TFT characteristics, the TEOS film having a thickness of about 50 nm may be formed as a passivation film before the formation of the second interlayer insulating film.

(8) Step of Forming Contact Hole

Then, a resist film is patterned into a desired shape by photolithography, and then, the second interlayer insulating film 14a and the gate insulating film 12 are wet-etched using a fluorine acid etching solution to be provided with a contact hole for connecting the second source electrode 17a to the source region 12s of the semiconductor layer 12 and for connecting the drain electrode 17a to the drain region 12d of the semiconductor layer 12. Dry-etching may be used instead of the wet-etching.

(9) Step of Forming Second Source Electrode and Drain Electrode (Second Wiring Layer)

Then, a titanium (Ti) film, an aluminum film (Al) film, and a Ti film are formed in this order by sputtering, and the like. Then, a resist film is patterned into a desired shape by photolithography, and then, the metal multi-layer film of Ti/Al/Ti is patterned by dry etching to form the second source electrode 17a and the drain electrode 18a. The second source electrode 17a and the source region 12s are conducted to each other and the drain electrode 18a and the drain region 12d are conducted to each other, through the respective contact holes formed in the second interlayer insulating film 14a. The high-melting-point metals used for the above-mentioned gate electrode may be used as the material for the second wiring layer. In this case, the hydrogenation annealing step (for example, at 400° C.) described in can be performed at any time after the formation of the second wiring layer, for example, after completion of formation of the first interlayer insulating film. When Al, which deteriorates at 400° C., is used as the material for the second wiring layer, the hydrogenation annealing step is preferably performed before the formation of the second wiring layer.

(10) Step of Forming First Interlayer Insulating Film

Then, the first interlayer insulating film 15a composed of a $SiO_2$ film is formed by PECVD using TEOS as a raw material gas. The first interlayer insulating film 15a may be a $SiN_x$ film, a SiON film, and the like.

Spin-on glass materials (SOG materials) may preferably be used as the material for the first interlayer insulating film 15a instead of forming the film 15a by PECVD using TEOS as a raw material gas. The first interlayer insulating film 15a made of the SOG materials serves as a flattening film flattening unevenness due to a gate electrode layer such as the gate electrode 19 and the gate wiring, and the second wiring layer such as the second source electrode 17a, and the like. Therefore, the gate electrode layer and the second wiring layer can be formed with a large thickness. Therefore, short-circuit possibly occurring at a remaining portion of the wirings can be prevented. In addition, a wiring resistance can be reduced. The SOG materials are materials capable of providing a glass film (a silica membrane) by coating such as spin coating. Specifically, SOG materials having a Si—O—C bond as a skeleton and SOG materials having a Si—C bond as a skeleton are preferred as the SOG materials. More specific examples of the SOG materials include MSQ (Methl Sises-Quioxane) materials which are a methyl group-containing organic $SiO_2$, HSQ (Hydrogens Slises-Quioxane) materials which are a S—H-containing inorganic $SiO_2$, and a porous silica film. The first interlayer insulating film 15a may have a structure in which a SOG film (a flattening film) made of the SOG materials and an insulating film (for example, an inorganic insulating film) are stacked. The insulating film is formed by vapor phase deposition, such as CVD, sputtering, and the like, and has a substantially uniform thickness and no flattening function. More specifically, for example, in order to improve adhesion of a first wiring layer that is to be formed on the flattening film and in order to protect the flattening film in the etching of the first wiring layer, an insulating film (for example, an inorganic insulating film such as a $SiO_2$ film, a SiN film, and a SiNO film) having a small thickness may be formed on the flattening film by CVD or sputtering.

(11) Step of Forming Contact Hole

Then, a resist film is patterned into a desired shape by photolithography. Then, the first interlayer insulating film 15a is wet-etched using a fluorine acid etching solution. As a result, a contact hole for connecting the first source electrode 16a to the second source electrode 17a is formed. Dry-etching may be used instead of the wet-etching.

(12) Step of Forming First Source Electrode (First Wiring Layer)

Then, a Ti film, an Al film, and a Ti film are formed in this order in the same manner as in the formation of the second source electrode 17a and the drain electrode 18a. Then, a resist film is patterned into a desired shape by photolithography, and then, the metal multi-layer film of Ti/Al/Ti is patterned by dry etching, to form the first source electrode 16a. In this case, the first source electrode 16a and the second source electrode 17a are connected to each other through the contact hole formed in the first interlayer insulating film 15a.

The circuit board of Embodiment 1 is completed by the above-mentioned method. When being used for a display device, the circuit board of Embodiment 1 preferably includes a pixel electrode, a TFT for switching, and the like formed thereon. Further, such a display device including the circuit board of Embodiment 1 has a frame region with a reduced area because of the decrease in the wiring area of the circuit board.

Embodiment 2

FIG. 2 is a cross-sectional view schematically showing the circuit board in accordance with Embodiment 2.

As shown in FIG. 2, the circuit board in accordance with Embodiment 2 has the same configuration as in Embodiment 1, except that the first source electrode 16b is connected to the semiconductor layer 12b through a contact hole that penetrates the first interlayer insulating film 15b, the second interlayer insulating film 14b, and the gate insulating film 13b. A contact between the first source electrode 16b and the semiconductor layer 12b, and a contact between the first source electrode 16b and the second source electrode 17b are independently formed. In a configuration in which the first source electrode 16b is directly connected to the semiconductor layer 12b, no electrode for connecting the first source electrode 16b and the semiconductor layer 12b is formed therebetween, which allows an improvement in integration degree of the circuit. In a configuration in which the first source electrode 16b is connected to the second source electrode 17b, the second source electrode 17b is used as a wiring and can be connected to another circuit (for example, a TFT and the like) not just being used as an electrode connecting the first source electrode 16b to the semiconductor layer 12b. Further, the first source electrode 16b can be also used as a wiring. Therefore, the electrode 16b can form a branched wiring in addition to a branched wiring formed by the electrode 17b.

Embodiment 3

FIG. 3 is a cross-sectional view schematically showing a circuit board in accordance with Embodiment 3.

As shown in FIG. 3, a circuit board in accordance with Embodiment 3 has the same configuration as in Embodiment 1, except that the second source electrode 17c and the drain electrode 18c (the second wiring layer) are formed to have a thickness smaller than that of the first source electrode 16c (the first wiring layer). The first source electrode 16c has a structure in which a titanium film having a thickness of 100 nm, an aluminum film having a thickness of 400 nm, and a titanium film having a thickness of 100 nm are stacked in this order. The second source electrode 17c and the drain electrode 18c are connected to the semiconductor layer 12 through a contact hole penetrating the gate insulating film 13c and the first interlayer insulating film 15c. The electrodes 17c and 18c have a stacked-layer structure including a titanium film having a thickness of 100 nm, an aluminum film having a thickness of 200 nm, and a titanium film having a thickness of 100 nm. The electrodes 17c and 18c are formed to have a thickness smaller than that of the first source electrode 16c. Unevenness of the second interlayer insulating film 14c and the like due to the second source electrode 17c and the drain electrode 18c can be reduced by forming the electrodes 17c and 18c having a small thickness. As a result, possibility of occurrence of disconnection, due to step-cut, of the first wiring layer such as the first source electrode 16c is reduced. As a result, the yield is improved.

The thinning of the second source electrode 17c and the drain electrode 18c may cause an increase in wiring resistance. However, the second source electrode 17c and the drain electrode 18c, which is used as the interconnection wiring included in a circuit, have a wiring length shorter than that of the first source electrode 16c and so have little influence on wiring resistance. Therefore, the second source electrode 17c and the drain electrode 18c can be formed to have a thickness smaller than that of the first source electrode 16c. In the present Embodiment, the aluminum film is formed to have a thickness smaller than that of the first source electrode 16c and the titanium film is formed to have the same thickness as compared with the first source electrode 16c. The titanium film may be formed to have a thickness smaller than that of the first source electrode 16c.

Comparative Embodiment 1

FIG. 4 is a cross-sectional view schematically showing a configuration of a circuit board in accordance with Comparative Embodiment 1. The circuit board in accordance with Comparative Embodiment 1 has the same configuration as in Embodiment 1 as shown in FIG. 4, except that a source electrode and a drain electrode are not constituted by two layers, the source electrode 16 and the drain electrode 18 are formed in the same layer on the first interlayer insulating film 15 and are connected to the semiconductor layer 12 through a contact hole that penetrates the first interlayer insulating film 15 and the second interlayer insulating film 14. In this case, the source electrode 16 constitutes an interconnection wiring included in a circuit; and a signal supply wiring (a wiring not included in a circuit) such as a power line, a source bus line, and a video line. As a result, the wiring area is increased, possibly leading to an increase in area of a frame region of a display device including such a circuit board.

The present application claims priority to Patent Application No. 2007-286363 filed in Japan on Nov. 2, 2007 under the Paris Convention and provisions of national law in a designated State, the entire contents of which are hereby incorporated by reference.

EXPLANATION OF NUMERALS AND SYMBOLS

Figure 1:
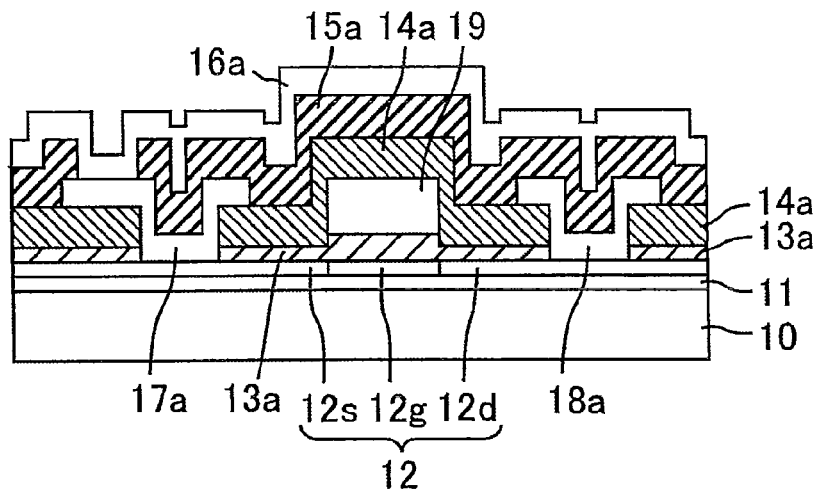
FIG. 1 is a cross-sectional view schematically showing a configuration of the circuit board in accordance with Embodiment 1.
Figure 2:
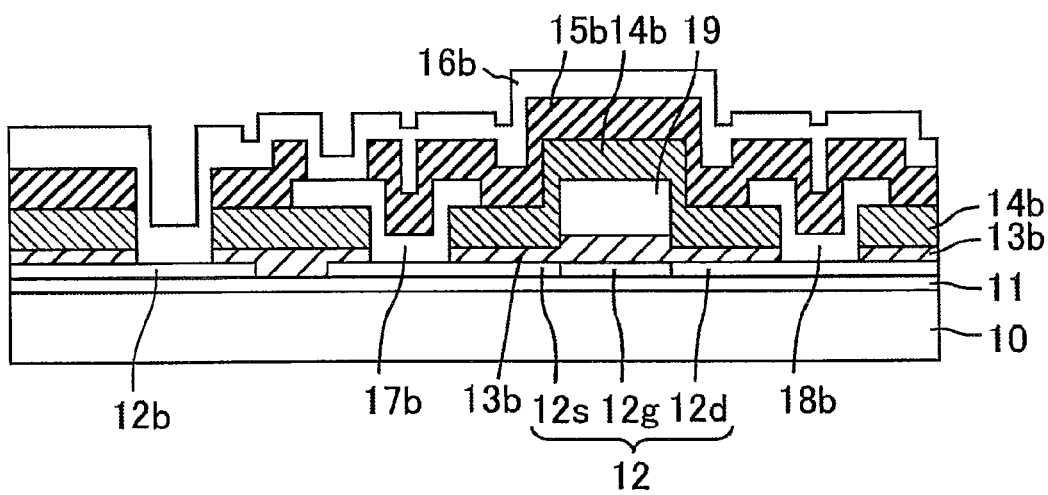
FIG. 2 is a cross-sectional view schematically showing a configuration of the circuit board in accordance with Embodiment 2.
Figure 3:
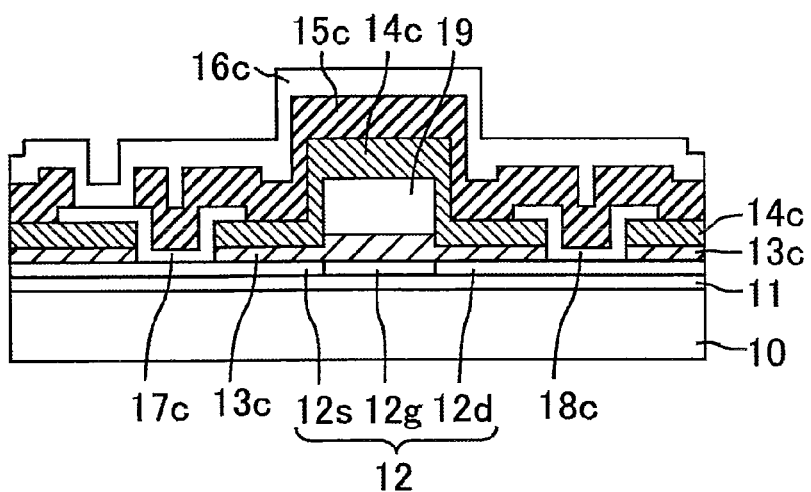
FIG. 3 is a cross-sectional view schematically showing a configuration of the circuit board in accordance with Embodiment 3.
Figure 4:
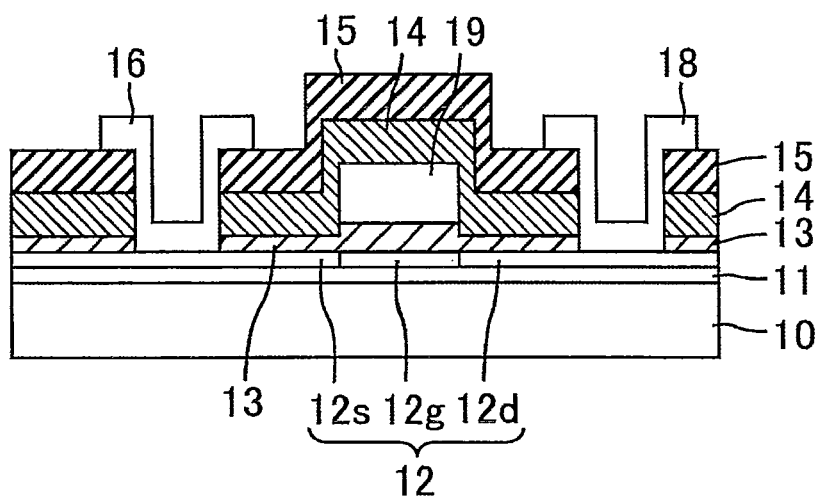
FIG. 4 is a cross-sectional view schematically showing a configuration of the circuit board in accordance with Comparative Embodiments 1.

10: Substrate
11: Base Coat Film
12 12b: Semiconductor layer
12d: Drain region
12g: Gate region
12s: Source region
13, 13a, 13b, 13c: Gate insulating film
14, 14a, 14b, 14c: Second interlayer insulating film
15, 15a, 15b, 15c: First interlayer insulating film
16: Source Electrode
16a, 16b, 16c: First source electrode
17a, 17b, 17c: Second source electrode
18, 18a, 18b, 18c: Drain electrode
19: Gate Electrode

The invention claimed is:

1. A circuit board comprising:
a substrate;
a semiconductor layer;
a gate insulating film;
a gate electrode layer; and
two or more interlayer insulating films,
the semiconductor layer, the gate insulating film, the gate electrode layer, and the two or more interlayer insulating films being stacked on the substrate in this order,
wherein the circuit board further includes a signal supply wiring and an interconnection wiring included in a circuit,
the signal supply wiring being arranged in a layer upper than the two or more interlayer insulating films,
the interconnection wiring included in a circuit being arranged between any adjacent two of the two or more interlayer insulating films, and
the signal supply wiring includes a first portion which directly connects to the semiconductor layer through a first contact hole, the first contact hole penetrating the two or more interlayer insulating films,
the signal supply wiring further includes a second portion which directly connects to the interconnection wiring included in a circuit through a second contact hole, the second contact hole penetrating at least one of the two or more interlayer insulating films, and
the signal supply wiring is arranged to overlap with the gate electrode layer.

2. The circuit board according to claim 1,
wherein the two or more interlayer insulating films are two interlayer insulating films composed of a first interlayer insulating film and a second interlayer insulating film, the second interlayer insulating film and the first interlayer insulating film being arranged in this order from the substrate side, and
wherein the signal supply wiring is arranged on the first interlayer insulating film, and
wherein the interconnection wiring included in a circuit is arranged between the first and second interlayer insulating films.

3. The circuit board according to claim 1,
wherein a total area of the interconnection wiring included in a circuit is smaller than a total area of the signal supply wiring.

4. The circuit board according to claim 1,
wherein the interconnection wiring included in a circuit has a wiring length shorter than a wiring length of the signal supply wiring.

5. The circuit board according to claim 1,
wherein the interconnection wiring included in a circuit has a thickness smaller than a thickness of the signal supply wiring.

6. The circuit board according to claim 2,
wherein the first interlayer insulating film is a silicon oxide film, and
the second interlayer insulating film is a silicon nitride film.

7. The circuit board according to claim 2,
wherein the first interlayer insulating film includes a spin-on-glass material.

8. A circuit board comprising:
a substrate;
a semiconductor layer;
a gate insulating film;
a gate electrode layer; and
two or more interlayer insulating films,
the semiconductor layer, the gate insulating film, the gate electrode layer, and the two or more interlayer insulating films being stacked on the substrate in this order,
wherein the circuit board further includes a wiring not included in a circuit and an interconnection wiring included in a circuit,
the wiring not included in a circuit being arranged in a layer upper than the two or more interlayer insulating films,
the interconnection wiring included in a circuit being arranged between any adjacent two of the two or more interlayer insulating films, and
the wiring not included in a circuit includes a first portion which directly connects to the semiconductor layer through a first contact hole, the first contact hole penetrating the two or more interlayer insulating films,
the wiring not included in a circuit further includes a second portion which directly connects to the interconnection wiring included in a circuit through a second contact hole, the second contact hole penetrating at least one of the two or more interlayer insulating films, and
the wiring not included in a circuit is arranged to overlap with the gate electrode layer.

9. A display device comprising the circuit board according to claim 1.

* * * * *